(12) United States Patent
Nakanishi

(10) Patent No.: US 7,023,407 B2
(45) Date of Patent: Apr. 4, 2006

(54) LUMINOUS DEVICE AND ELECTRONIC APPLIANCES

(75) Inventor: Hayato Nakanishi, Toyuma (JP)

(73) Assignee: Seiko Epson Corporation, Tokyo (JP)

(*) Notice: Subject to any disclaimer, the term of this patent is extended or adjusted under 35 U.S.C. 154(b) by 325 days.

(21) Appl. No.: 10/349,075

(22) Filed: Jan. 23, 2003

(65) Prior Publication Data

US 2003/0169242 A1   Sep. 11, 2003

(30) Foreign Application Priority Data

Jan. 24, 2002 (JP) ............................ 2002-016118
Jan. 21, 2003 (JP) ............................ 2003-012348

(51) Int. Cl.
*G09G 3/30* (2006.01)

(52) U.S. Cl. ........................................... 345/76

(58) Field of Classification Search ............... 345/60, 345/74.1, 75.2, 76–77, 82–84, 92, 204, 90, 345/214; 313/586
See application file for complete search history.

(56) References Cited

U.S. PATENT DOCUMENTS

| | | | |
|---|---|---|---|
| 5,382,477 A * | 1/1995 | Saito et al. ................ 428/690 |
| 5,936,598 A * | 8/1999 | Hayama et al. ............ 345/76 |
| 6,242,860 B1 * | 6/2001 | Sasao et al. ............... 313/586 |
| 6,290,352 B1 | 9/2001 | Marumoto et al. | |
| 6,304,670 B1 | 10/2001 | Berestov | |
| 6,312,771 B1 | 11/2001 | Kashiwazaki et al. | |
| 6,341,862 B1 | 1/2002 | Miyazaki et al. | |
| 6,342,321 B1 | 1/2002 | Sakamoto et al. | |
| 6,359,606 B1 | 3/2002 | Yudasaka | |
| 6,364,450 B1 | 4/2002 | Yamaguchi et al. | |
| 6,380,689 B1 * | 4/2002 | Okuda ..................... 315/169.3 |
| 6,386,700 B1 | 5/2002 | Akahira | |
| 6,394,578 B1 | 5/2002 | Akahira et al. | |
| 2001/0015626 A1 * | 8/2001 | Ozawa ..................... 315/169.1 |

FOREIGN PATENT DOCUMENTS

| | | |
|---|---|---|
| EP | 0 984 303 A1 | 3/2000 |
| EP | 1 209 744 A2 | 5/2002 |
| JP | A 11-024604 | 1/1999 |
| JP | A 2001-109395 | 4/2001 |
| JP | A 2001-318628 | 11/2001 |
| JP | 2001-343911 | 12/2001 |
| JP | A 2002-022924 | 1/2002 |
| KR | 2000-68846 | 11/2000 |
| KR | 2001-93076 | 10/2001 |

* cited by examiner

*Primary Examiner*—Ricardo Osorio
*Assistant Examiner*—Mansour M. Said
(74) *Attorney, Agent, or Firm*—Oliff & Berridge, PLC

(57) ABSTRACT

The invention provides a luminous device that is able to effectively utilize a display surface without causing abnormal display of the image, such as decrease of contrast, by stabilizing supply of the image signal by reducing the parasitic capacitance between the wiring lines. The invention also provides electronic appliances including the luminous device. A scanning line 101 to supply a scanning signal to a switching element, such as a TFT, for the pixel is formed under a bank (dummy bank) provided between the luminous elements and partitioning between the luminous elements. A cathode is formed above the bank and on the luminous element (dummy luminous element). The parasitic capacitance between the cathode and scanning line can be reduced by placing the scanning line under the bank.

17 Claims, 12 Drawing Sheets

(a)

(b)

(c)

(d)

(a)

(b)

(c)

(a)

(b)

(c)

(a)

(b)

(c)

LUMINOUS DEVICE AND ELECTRONIC APPLIANCES

BACKGROUND OF THE INVENTION

1. Field of Invention

The invention relates to a luminous device and electronic appliances. In particular, the invention relates to a luminous device including organic electroluminescence materials and an electronic device incorporating the luminous device.

2. Description of Related Art

The related art includes a colored luminous device having a structure in which a luminous element that includes a luminous material, such as an organic fluorescent material, is interposed between a pixel electrode (anode) and cathode. In particular, the related art includes an organic electroluminescent (organic EL) device using an organic EL material. The related art luminous device (organic EL device) is briefly described below.

FIG. 12 is a schematic that shows an wiring structure of the related art luminous device. As shown in FIG. 12, a plurality of scanning lines 901, a plurality of signal lines 902 extending in a direction perpendicular to the scanning lines 901, and a plurality of power lines 903 extending in parallel to the signal lines 902 are wired in the related art luminous device. A pixel region A is provided at each cross-point between the scanning line 901 and signal line 902. Each of the signal lines 902 is connected to a data side addressing circuit 904 including a shift register, level shifter, video line and analogue switch, and each of the scanning lines 901 is connected to a scanning side addressing circuit 905 including a shift register and level shifter.

Each pixel region A includes a switching thin film transistor 913 to supply a scanning signal to a gate electrode through the scanning line 901, a retention capacitor Cap to retain an imaging signal supplied from the signal line 902 through the switching thin film transistor 913, a current thin film transistor 914 to supply the imaging signal retained by the retention capacitor Cap to the gate electrode, a pixel electrode 911 into which an addressing current flows from the power line 903 when the electrode is electrically connected to the power line 903 through the current thin film transistor 914, and a luminous layer 910 interposed between the pixel electrode 911 and cathode 912. The cathode 912 is connected to an electric power circuit 931 for the cathode.

The luminous layer 910 includes three kinds of luminous elements of a red luminous layer 910R, green luminous layer 910G and blue luminous layer 910B, and the luminous layers 910R, 910G and 910B are arranged as stripes. The power lines 903R, 903G and 903B connected to the luminous layers 910R, 910G and 910B, respectively, via the respective current thin film transistors 914 are connected to respective luminescent electric power circuits 932. The power line is independently wired for each color since the addressing potential of the luminous layer 910 is different for each color.

In the above construction, an electrical charge corresponding to the imaging signal supplied to the signal line 902 is retained in the retention capacitor Cap, when the switching thin film transistor 913 is turned ON as a result of supplying a scanning signal to the scanning line 901. The current thin film transistor 914 is turned On or OFF depending on the amount of the electrical charge retained in the retention capacitor Cap. Then, an electric current flows into each pixel electrode 911 from the power line 903R, 903G or 903B through the current thin film transistor 914, and an addressing current flows into each cathode 912 through the luminous layer 910. A light corresponding to the amount of the electric current through the luminous layer 910 is emitted from the luminous layer 910.

The addressing method to address each electrooptical element by a pixel circuit provided for each of the plural electrooptical elements is referred to as "an active matrix addressing method," and is disclosed in WO 98/3640.

SUMMARY OF THE INVENTION

Potential variation of the addressing current applied to the pixel electrode 911 from the power line 903 is required to be as small as possible, in order to stably emit a light from the luminous layer 910 provided in the luminous device as described above. However, a parasitic capacitance is generated between the power lines 903 and scanning lines 901 or signal lines 902, since the scanning lines 901, signal lines 902 and power lines 903 are collectively wired. It becomes impossible to supply the imaging signal to the pixel region A within a prescribed period of time when the parasitic capacitance is large, which creates a problem that normal images cannot be displayed by poor contrast of the image.

When the luminous device is used for portable electronic appliances, for example the luminous device in a portable phone, the display area is required to be large, while the device needs to be small and lightweight. In order to satisfy both requirements, the electronic appliances should be constructed so as to advantageously utilize the display area of the luminous device.

The invention takes the above and/or other situations into consideration, and provides a luminous device and electronic appliances incorporating the luminous device, whereby imaging signals are stably supplied by reducing the parasitic capacitance between the wiring lines, and no, or substantially no, abnormal state of the display image, such as decrease of contrast, is caused, thereby effectively utilizing the display area.

In a first exemplary aspect to address or solve the above, the invention provides a luminous device including a first electrode, a switching element connected to the first electrode, a luminous element having a luminous layer formed between the first electrode and a second electrode, an effective luminous region including the plural luminous elements, and a dummy region formed at the outside of the effective luminous region. An insulation member is formed in the dummy region, and a scanning line to supply a scanning signal to scan the switching element is formed below the insulation member.

According to the invention, the parasitic capacitance can be reduced since the scanning line is formed below the insulation member in the dummy region outside of the effective luminous region responsible for display of the image, and the dummy region does not contribute to display of the image.

Preferably, a plurality of interlayer insulation layers are formed between the scanning line and insulation member.

According to the invention, the distance between the scanning line and second electrode can be increased by forming a plurality of interlayer insulation layers between the scanning line and insulation member, which is suitable to reduce the parasitic capacitance generated between the scanning line and second electrode.

Preferably, the second electrode is formed so as to cover at least the effective luminous layer and dummy region.

A positive hole injection/transfer layer may be formed in the luminous device as described above.

According to the invention, the luminous element includes the positive hole injection/transfer layer laminated on the luminous layer, and an addressing current with little variation of the potential is applied to the luminous layer to enable a highly luminous and precise colors to be displayed.

In a second exemplary aspect, the invention addresses or solves the above by providing a luminous device including an effective luminous region including a luminous layer formed between a first electrode and a second electrode, and a dummy region formed at the outside of the effective luminous region. The effective luminous region includes a plurality of luminous elements and a pixel circuit to address each element of the plurality of luminous element. The dummy region includes an insulation member formed therein, and a part of scanning lines to supply a scanning signal to the pixel circuit is formed below the insulation member. The signal line to supply a data signal to each pixel circuit is formed to be perpendicular to the scanning lines, and at least an interlayer insulation layer is formed between the signal line and the second electrode.

Preferably, the luminous device further includes power lines to supply an addressing power to each luminous element corresponding to respective pixel circuits through the pixel circuits, and the power line is formed on a different layer from the layer including the scanning line. Such construction permits the space for wiring lines to be effectively utilized.

Preferably, the portion of the power line disposed at least within the effective luminous region is formed between the scanning lines and the second electrode in the luminous device as described above. Such construction permits delay of the scanning signal supplied through the scanning lines to be avoided and indistinct images to be reduced from appearing, since scanning lines are formed with a distance apart from the second electrode as compared with the power lines. A capacitance may be purposely formed between the power line and second electrode, since the power line is wired closer to the second electrode than the scanning line. Purposely forming a capacitance between the wiring line and second electrode permits variation of the addressing power supplied through the power line to be reduced, thereby enabling the addressing power to be stabilized.

The interlayer insulation layer is preferably formed between the power lines and scanning lines in the luminous device as described above.

Preferably, the second electrode is formed so as to cover at least the effective luminous region and dummy region in the luminous device as described above.

Preferably, the positive hole injection/transfer layer is formed in the luminous element of the luminous device as described above.

In a third exemplary aspect, the invention provides a luminous device including: an effective luminous region including a plurality of luminous elements including a luminous layer formed between a first electrode and a second electrode; a dummy region formed at the outside of the effective luminous layer; pixel circuits to address the luminous elements; scanning lines to supply scanning signals to the pixel electrodes; and data signals to supply data signals to the pixel electrodes. A part of the data line is provided in the dummy region, and is placed with a distance apart from the second electrode by an insulation member provided in the dummy region.

Preferably, at least a functional layer constituting the luminous element is disposed in the dummy region, and an insulation member is provided at the periphery of the functional layer in the luminous device as described above.

An electronic appliance of the invention incorporates the luminous device as described above.

BRIEF DESCRIPTION OF THE DRAWINGS

FIG. 5 is a cross-sectional view showing a significant part of the pixel electrode group region 11a;

DETAILED DESCRIPTION OF PREFERRED EMBODIMENTS

Figure 1:
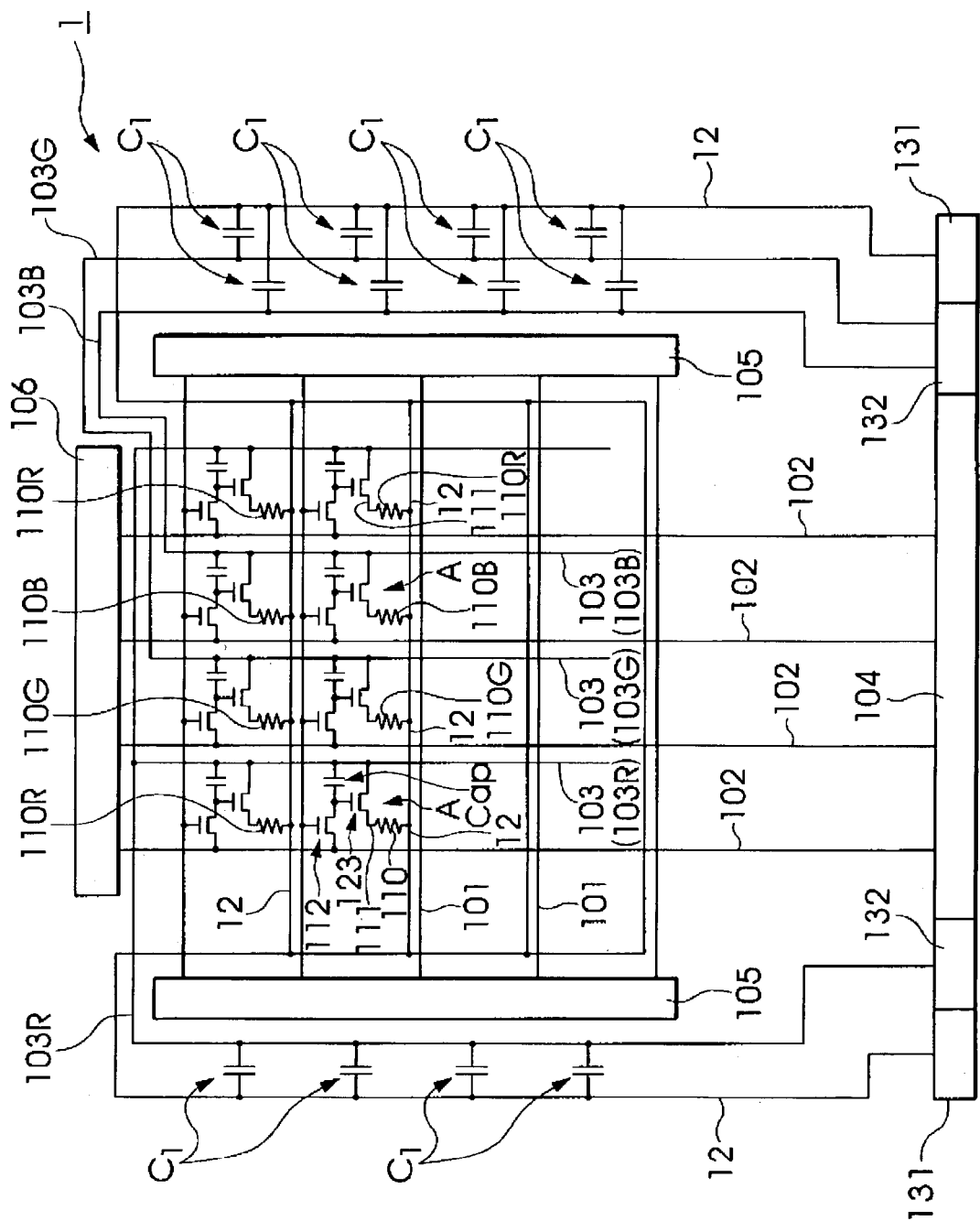
FIG. 1 is a schematic of the wiring diagram of a luminous device according to one exemplary embodiment of the invention.

The luminous device and electronic appliances of an exemplary embodiment of the invention are described in detail below with reference to the drawings. The scales of each layer and each member in the drawings in the following descriptions merely provided for illustrating each layer and each member. FIG. 1 is a schematic of the wiring diagram of a luminous device in one exemplary embodiment of the invention.

The luminous device 1 shown in FIG. 1 is an active matrix organic EL device using a thin film transistor as a switching element. A plurality of scanning lines 101, a plurality of signal lines 102 extending in the direction perpendicular to the scanning lines 101, and a plurality of power lines 103 extending parallel to the signal lines 102 are wired in the luminous device 1 shown in FIG. 1. A pixel region is provided at the cross-point between each scanning line 101 and signal line 102.

A data side addressing circuit 104 including a shift resister, level resister, video line and analogue switch is connected to each signal line 102. An inspection circuit 106 including a thin film transistor is connected to each signal line 102. In addition, a scanning side addressing circuit 105 including a shift resister and level resister is connected to each scanning line 101.

Each pixel region A includes a switching thin film transistor (a first switching element) 112, a retention capacitor Cap, a current thin film transistor (a second switching element) 123, a pixel electrode (a first electrode) 111, a luminous layer 110 and a cathode (a second electrode) 12. The first and second switching elements correspond to the switching elements as used in the invention, and a pixel circuit is formed of the two transistors. The scanning line 101 is connected to the gate electrode of the switching thin film transistor 112, which is turned on or off by being addressed by a scanning signal supplied from the scanning line 101. The retention capacitor Cap retains an imaging signal supplied from the signal line 102 through the switching thin film transistor 112.

The gate electrode of the current thin film transistor 123 is connected to the switching thin film transistor 112 and retention capacitor Cap, and the imaging signal retained in the retention capacitor Cap is supplied to the gate electrode. The pixel electrode 111 is connected to the current thin film transistor 123, and an addressing current flows in from the current thin film transistor 123 when the pixel electrode is electrically connected to the power line 103 through the current thin film transistor 123. The luminous layer 110 is formed between the pixel electrode 111 and cathode 12.

The luminous layer 110 formed by at least the anode, luminous device and cathode includes three kinds of luminous elements of a red luminous layer 110R, green luminous layer 110G and blue luminous layer 110B, and the luminous layers 110R, 110G and 110B are arranged as stripes. The power lines 103R, 103G and 103B connected to the luminous layers 110R, 110G and 110B, respectively, trough the current thin film transistor 123 are connected to respective power lines 132 for the luminous layers. The power lines 103R, 103G and 103B are connected for respective colors since the addressing potentials for the luminous layer 110R, 110G and 110B are different for respective colors.

A first electrostatic capacitor C1 is formed between the cathode 12 and each power line 103R, 103G and 103B in the luminous device in this exemplary embodiment, and an electrostatic charge is accumulated in the first capacitor C1 when the luminous device 1 is addressed. When the potential of the addressing current flowing through each power line 103 changes during addressing of the luminous device 1, the accumulated charge is discharged into each power line to suppress or reduce potential changes of the addressing current, thereby enabling the luminous device to constantly display a normal image.

The potential of the signal line 102 is retained in the retention capacitor Cap in the luminous device 1 when the switching thin film transistor 112 is turned on by supplying a scanning signal from the scanning line 101, and the current thin film transistor 123 is determined whether it is turned on or off depending on the potential retained in the retention capacitor Cap. An addressing current flows to the pixel electrode 111 from the power lines 110R, 110G and 110B through the channel of the current thin film transistor 123, and another current flows to the cathode 12 through the luminous layers 110R, 110B and 110G. A light with an intensity depending on the amount of the electric current flowing through the luminous layer 110 is emitted from the luminous layer 110.

Figure 2:
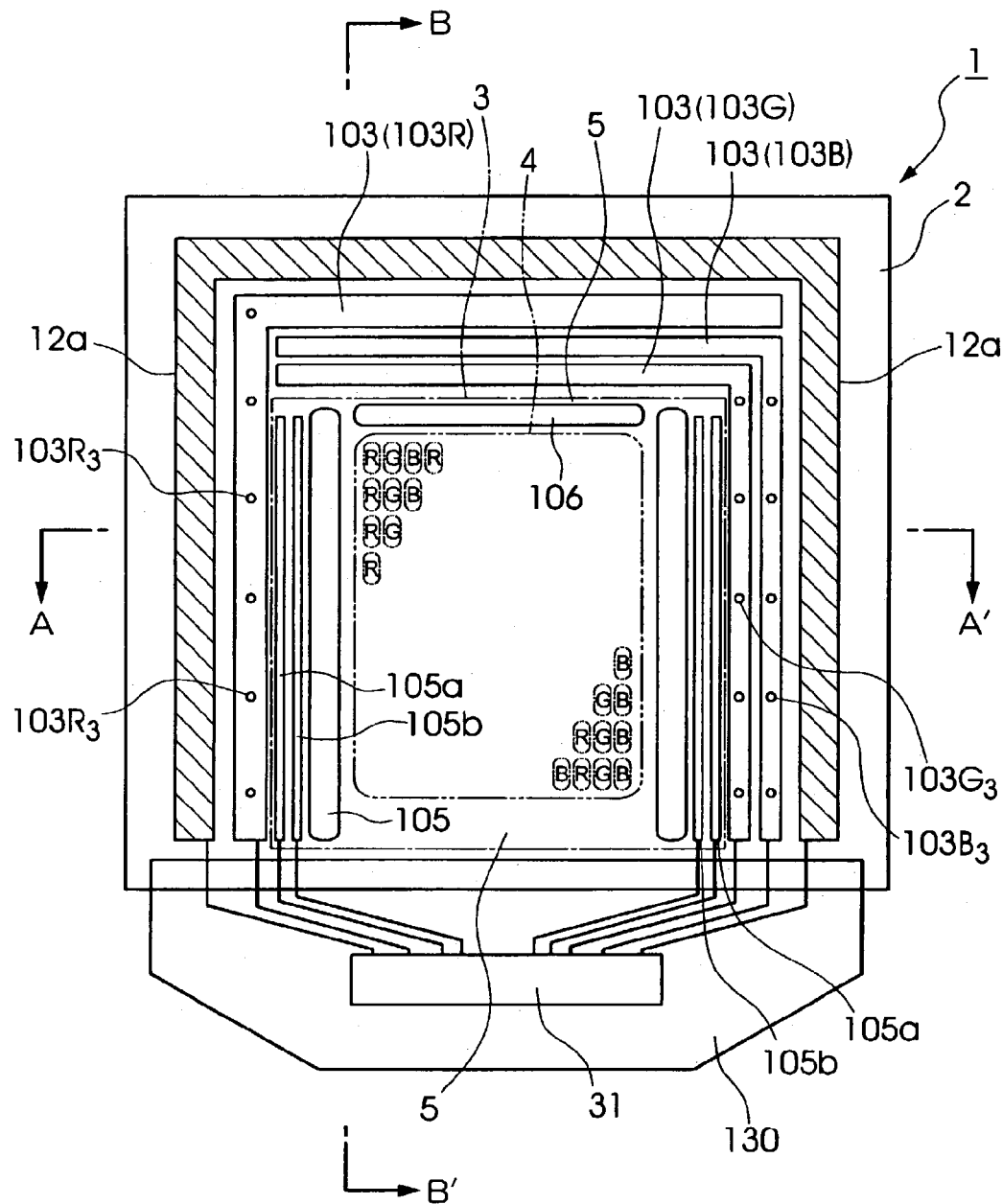
FIG. 2 is a schematic plan view of the luminous device in one exemplary embodiment of the invention.
Figure 3:
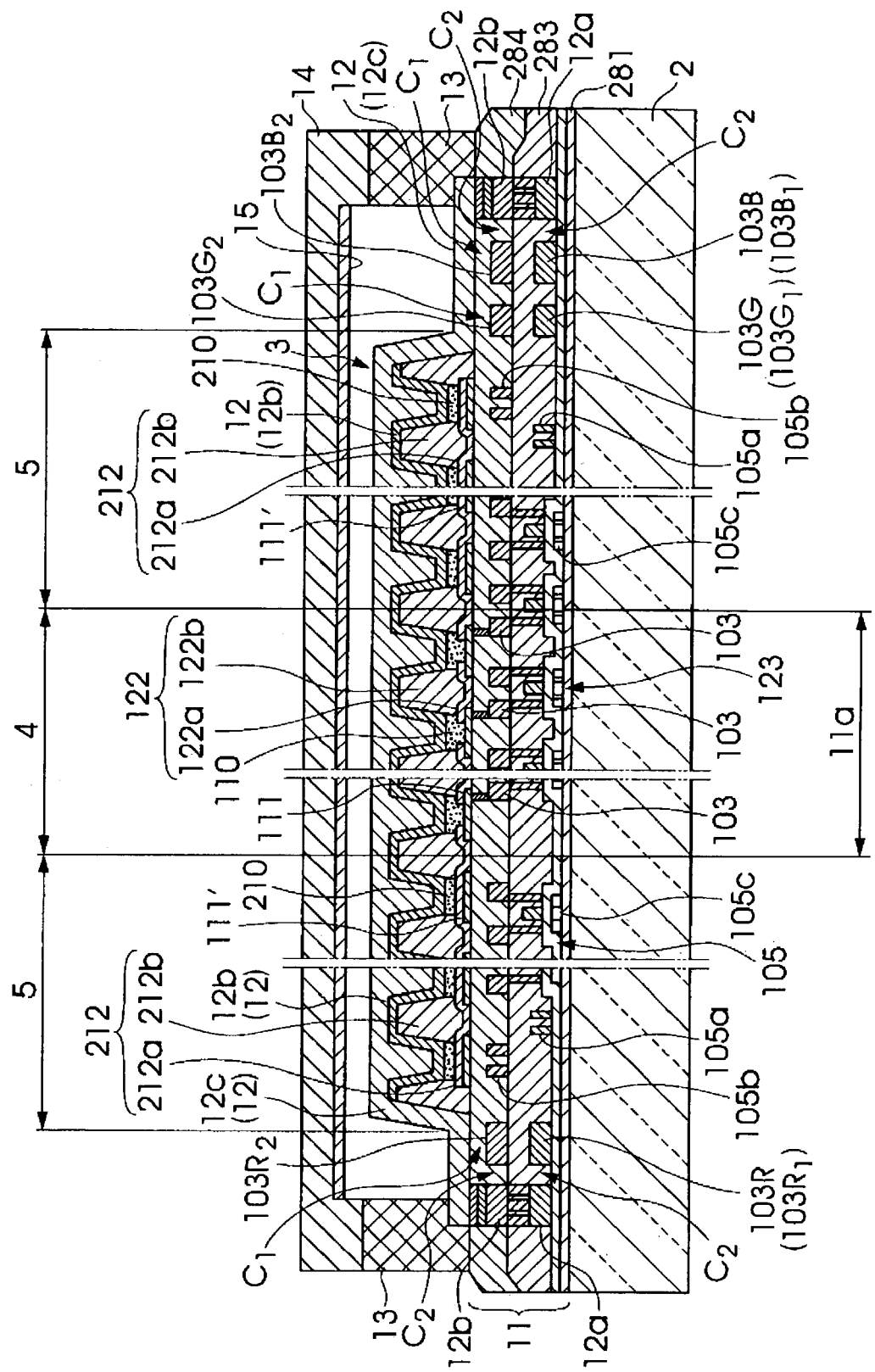
FIG. 3 is a cross-sectional view taken along plane AA' in FIG. 2.
Figure 4:
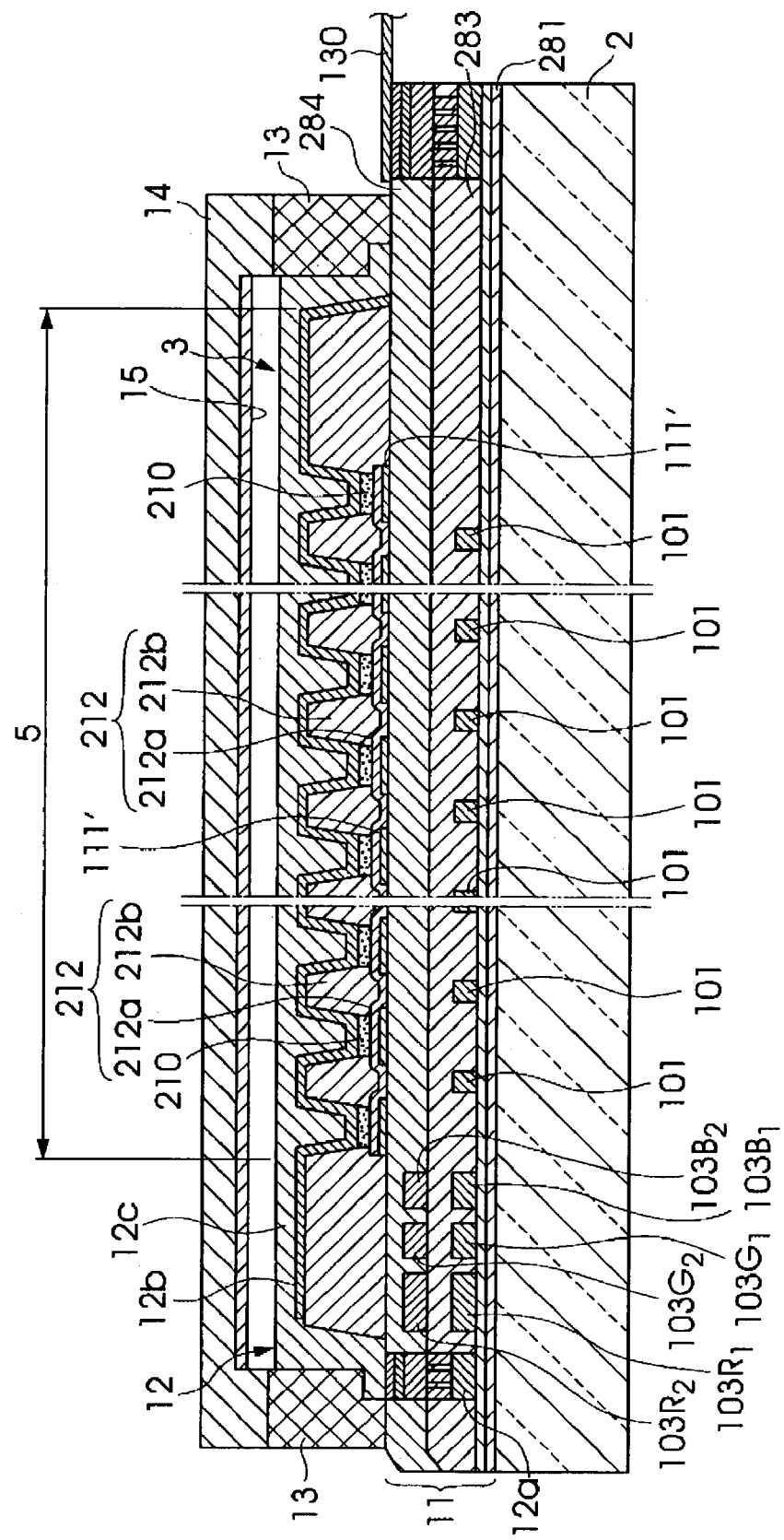
FIG. 4 is a cross-sectional view along plane B–B' in FIG. 2.

Examples of the construction of the luminous layer 1 of the exemplary embodiment will be described hereinafter with reference to FIGS. 2 to 4. FIG. 2 is a schematic plan view of the luminous device in this exemplary embodiment, FIG. 3 is a cross-sectional view taken along plane A–A' in FIG. 2, and FIG. 4 is a cross-sectional view taken along plane B–B' in FIG. 2. As shown in FIG. 2, the luminous device 1 in this embodiment includes a substrate 2, a pixel electrode group region (not shown), power lines 103 (103R, 103G and 103B), and a pixel region 3 (within the frame surrounded by a dotted broken line in the drawing).

The substrate 2 is a transparent substrate made of, for example, a glass. The pixel electrode group region includes the pixel electrodes (not shown) connected to the current thin film transistor 123 shown in FIG. 1, and the pixel electrodes are arranged as a matrix on the substrate 2. The power lines 103 (103R, 103G and 103B) are disposed around the pixel electrode group region as shown in FIG. 2, and are connected to respective pixel electrodes. The pixel region 3 is at least positioned on the pixel electrode group region with a rectangular plane view. The pixel region 3 is partitioned into an effective luminous region 4 (within the double-dot broken line in the drawing) at the central area and a dummy region 5 disposed at the outside of the effective luminous region 4 (the region between the dotted broken line and the double-dot broken line).

The scanning line addressing circuits 105 are disposed at both sides of the effective luminous region 4. The scanning line addressing circuit 105 is provided under the dummy region 5 (at the substrate 2 side). A control signal line 105*a* to address the scanning line and a power line 105*b* to address the scanning line to be connected to the scanning line addressing circuit 105 are provided under the dummy region 5. In addition, the inspection circuit 106 is disposed above the effective luminous region 4 in the drawing. The inspection circuit 106 is provided so as to position under the dummy region 5 (at the substrate 2 side). The quality and defects of the luminous device in the manufacturing process and shipment can be inspected by the inspection circuit 106.

As shown in FIG. 2, the power lines 103R, 103G and 103B are disposed around the dummy region 5. The power lines 103R, 103G and 103B are extended from the bottom to the top of the substrate 2 along the power line 105*b* to address the scanning line as shown in FIG. 2, extended along the outer side edge of the dummy region 5 after being bent at the position where the power line 105*b* to address the scanning line comes to its end, and connected to the pixel electrode (not shown) within the effective luminous region 4. A cathode line 12*a* to be connected to the cathode 12 is formed on the substrate 2. The cathode line 12*a* has an open square shape in the plane view, and is disposed so as to surround the power lines 103R, 103G and 103B.

A polyimide tape 130 is attached at one end of the substrate 2, and a control IC 31 is mounted on the polyimide tape 130. The data side addressing circuit 104 as shown in FIG. 1, a cathode power circuit 131 and a power circuit 132 for the luminous layer are integrated in the control IC 31.

As shown in FIGS. 3 and 4, a circuit 11 is formed on the substrate 2, and a pixel portion 3 is formed on the circuit 11. An annular sealing member 13 surrounding the pixel portion 3 is formed on the substrate 2 with a seal substrate 14 formed on the pixel portion 3. The seal substrate 14 made of a glass, metal or resin is bonded to the substrate 2 with interposition of the seal member 13. An adsorbing agent 15 is bonded at the back side of the seal substrate 14 so as to absorb water or oxygen invaded in the space between the pixel portion 3 and seal substrate 14. A getter agent may be used in place of the absorbing agent 15. The seal member 13 is made of a thermosetting resin or UV curing resin, and an epoxy resin as one of the thermosetting resins is particularly preferable.

A pixel electrode group region 11*a* is provided at the center of the circuit 11. The pixel electrode group region 11*a* includes the current thin film transistor 123, and the pixel electrode 111 connected to the current thin film transistor 123. The current thin film transistor 123 is formed so as to be embedded in a protective underlayer 281, a second interlayer insulation layer 283 and a first interlayer insulation layer 284 laminated on the substrate 2, and the pixel electrode 111 is formed on the first interlayer insulation layer 284. The power lines 103 (103R, 103G and 103B) are connected to one of the electrode (source electrode) connected to the current thin film transistor 123 and formed on the second interlayer insulation layer 283. While the retention capacitor Cap and switching thin film transistor 112 are also formed in the circuit 11, they are omitted in FIGS. 3 and 4. The signal lines 102 are also omitted in FIGS. 3 and 4. Furthermore, the switching thin film transistor 112 and current thin film transistor 123 are also omitted in FIG. 4.

In FIG. 3, the scanning line addressing circuit 105 is provided at both sides of the pixel electrode group region 11a. The scanning line addressing circuit 105 shown in FIG. 3 is provided with a N-channel or P-channel thin film transistor 105c constituting an inverter included in the shift resister, and the thin film transistor 105c has the same structure as the current thin film transistor 123 except that the former is not connected to the pixel electrode 111. While the inspection circuit 106 is omitted in FIG. 4, the inspection circuit 106 also includes the thin film transistor. The thin film transistor provided in the inspection circuit 106 also has the same structure as the current thin film transistor 123, except that the former is not connected to the dummy pixel electrode 111' is described below.

As shown in FIG. 3, the control signal line 105a for the scanning line circuit is formed on the protective underlayer 281 at the outside of the scanning line addressing circuit 105. As shown in FIG. 4, the scanning line 101 is formed on the protective underlayer 281. Furthermore, the power line 105b for the scanning line circuit is formed on the second interlayer insulation layer 283 at the outside of the control signal line 105a for the scanning line circuit. The power line 103 is formed at the outside of the power line 105b for the scanning line circuit. The power line 103 employs a double wiring structure including dual wiring lines, and is wired at the outside of the pixel portion 3 as described above. The double wiring structure permits wiring resistance to be reduced.

The power line 103R for the red color at the left side in FIG. 3 includes a first power line $103R_1$ formed on the protective underlayer 281, and a second power line $103R_2$ formed on the first power line $103R_1$ through second interlayer insulation layer 283. The first power line $103R_1$ and the second power line $103R_2$ are connected with each other through a contact hole $103R_3$ penetrating through the second interlayer insulation layer 283. The first power line $103R_1$ is formed at the same layer level as the cathode line 12a, and the second interlayer insulation layer 283 is disposed between the first power line $103R_1$ and cathode line 12a. As shown in FIGS. 3 and 4, the cathode line 12a is electrically connected to the cathode line 12b formed on the second interlayer insulation layer 283 through the contact hole, and the cathode line 12a also forms the so-called double wiring structure. Therefore, the second power line $103R_2$ is formed on the same layer level as the cathode line 12b, and the first interlayer insulation layer 284 is formed between the second power line $103R_2$ and cathode line 12b. Such structure permits an electrostatic capacitor C2 to be formed between the first power line $103R_1$ and cathode line 12a, and between the second power line $103R_2$ and cathode line 12b.

The power lines 103G and 103B for the green and blue colors, respectively, at the right side in FIG. 3 also employ the double wiring structure, which is formed of the first power lines $103G_1$ and $103B_1$ formed on the protective underlayer 281, and the second power lines $103G_2$ and $103B_2$ formed on the second interlayer insulation layer 283. The first power lines $103G_1$ and $103B_1$, and the second power lines $103G_2$ and $103B_2$ are connected through the contact holes $103G_3$ and $103B_3$, respectively, penetrating through the second interlayer insulation layer 283, as shown in FIGS. 2 and 3. A second electrostatic capacitor C2 is formed between the blue first power line $103B_1$ and cathode line 12a, and between blue second power line $103B_2$ and cathode line 12b.

The distance between the first power line $103R_1$ and second power line $103R_2$ is preferably, for example, in the range of 0.6 to 1.0 μm. It is not preferable that the distance is less than 0.6 μm, since the parasitic capacitance increases between a source metal and gate metal such as the signal line 102 and scanning line 101 having different potentials with each other. For example, many cross-points between the source metal and gate metal, are formed within the effective luminous region 4, and a time lag of the imaging signal may be caused when a large parasitic capacitance is accumulated at these points. As a result, the contrast of the image decreases since the imaging signal cannot be written in the pixel electrode 111 within a prescribed time interval. While the second interlayer insulation layer 283 interposed between the first and second power lines $103R_1$ and $103R_2$ is preferably made of $SiO_2$, the substrate 2 may be cracked by the stress of $SiO_2$ when the second insulation layer is formed with a thickness of 1.0 μm or more.

The cathode 12 protruded out of the pixel portion 3 is formed on each power line 103R. The second power line $103R_2$ of the power lines 103R is placed to face the cathode 12 with interposition of the first interlayer insulation layer 284, thereby forming the first electrostatic capacitor C1 between the second power line $103R_2$ and cathode 12. The distance between the second power line $103R_2$ and cathode 12 is preferably, for example, in the range of 0.6 to 1.0 μm. Since the parasitic capacitance between the pixel electrode and source electrode having different potentials with each other increases when the distance is less than 0.6 μm, the signal from the signal line using the source metal is delayed. As a result, the contrast of the image decreases since the imaging signal cannot be written within a prescribed time interval. The first interlayer insulation layer 284 interposed between the second power line $103R_2$ and cathode 12 is preferably made of $SiO_2$ or an acrylic resin. However, the substrate 2 may be cracked by the stress when the $SiO_2$ layer is formed with a thickness of 1.0 μm or more. While the acrylic resin layer may be formed with a thickness of about 2.0 μm, the pixel electrode formed thereon may be cracked since the acrylic resin tends to be swelled by absorbing water.

Since the first electrostatic capacitor $C_1$ is formed between each power line 103 and cathode 12 in the luminous device in this embodiment, the electrostatic charge accumulated in the first electrostatic capacitor $C_1$ is supplied to each power line 103 in response to variation of the potential of the addressing current flowing through the power line 103. Deficiency of the potential of the addressing current is compensated by this electrostatic charge to suppress or reduce variation of the potential, and the luminous device 1 can display a normal image.

Since the power line 103 faces the cathode at the outside of the pixel portion 3, the electrostatic charge accumulated in the first electrostatic capacitor $C_1$ can be increased by reducing the distance between the power line 103 and cathode 12, thereby enabling the image to be stably displayed by further reducing variation of the potential of the addressing current. In addition, the power line 103 has a double wiring structure including the first and second power lines, and the second electrostatic capacitor $C_2$ is formed between the first power line and cathode line to enable the electrostatic charge accumulated in the second electrostatic capacitor $C_2$ to be supplied to the power line 103. Consequently, variation of the potential can be further suppressed or reduced and the luminous device 1 can display a normal image.

Figure 5:
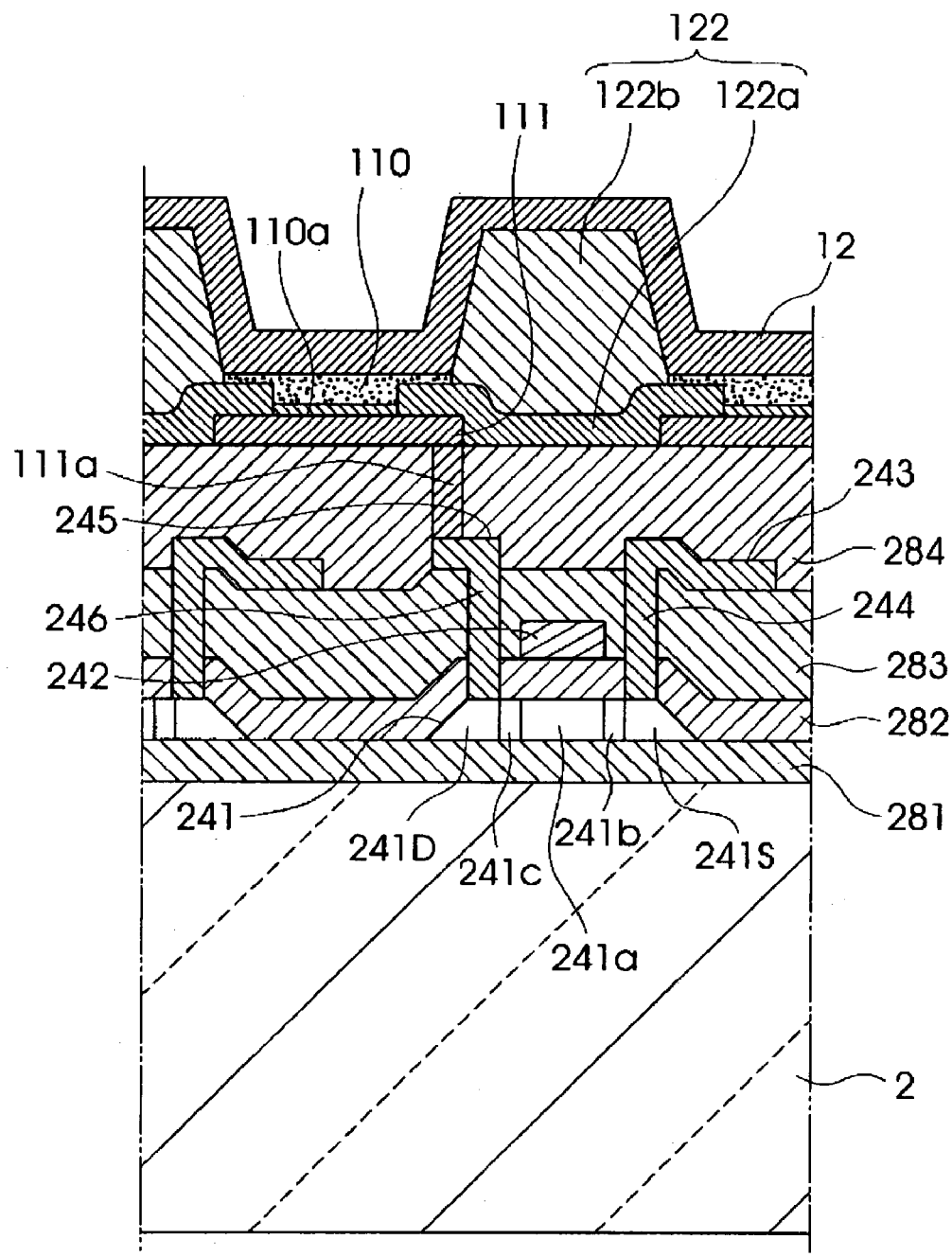
Figure 6:
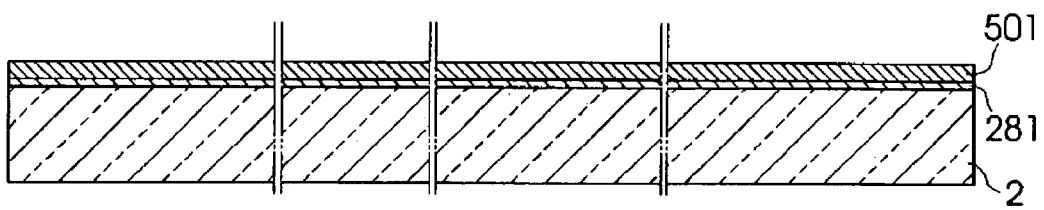
FIGS. 6(a)–6(d) are schematics describing a method for manufacturing the luminous device according to one exemplary embodiment of the invention.
Figure 6:
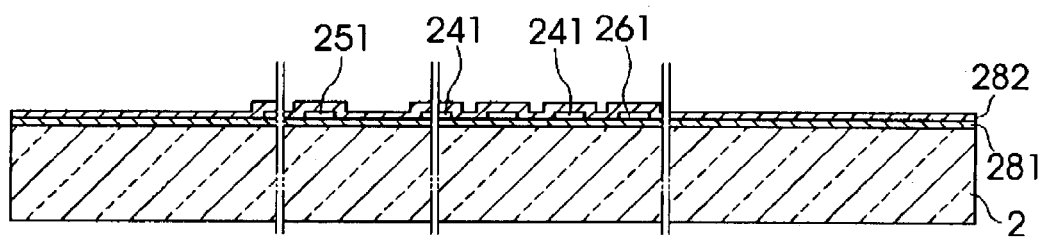
Figure 6:
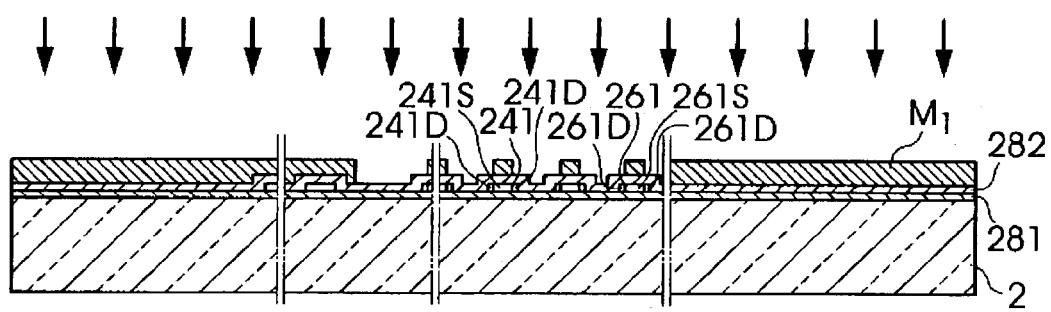
Figure 6:
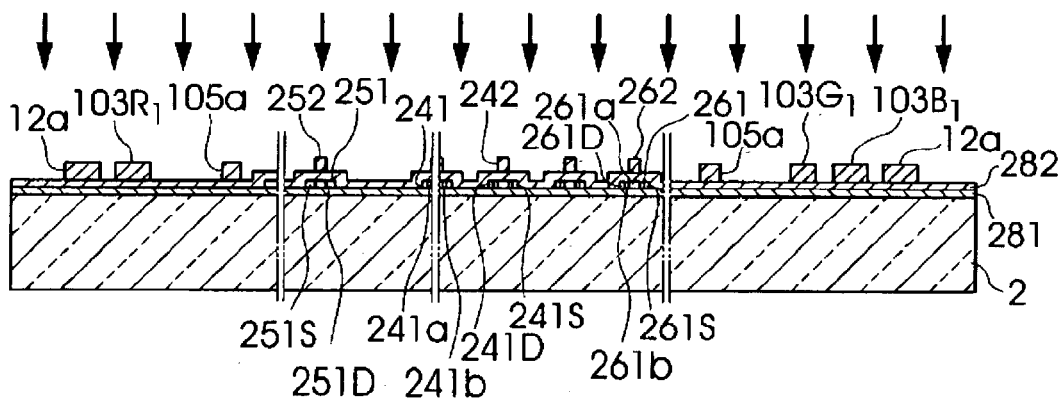
Figure 7:
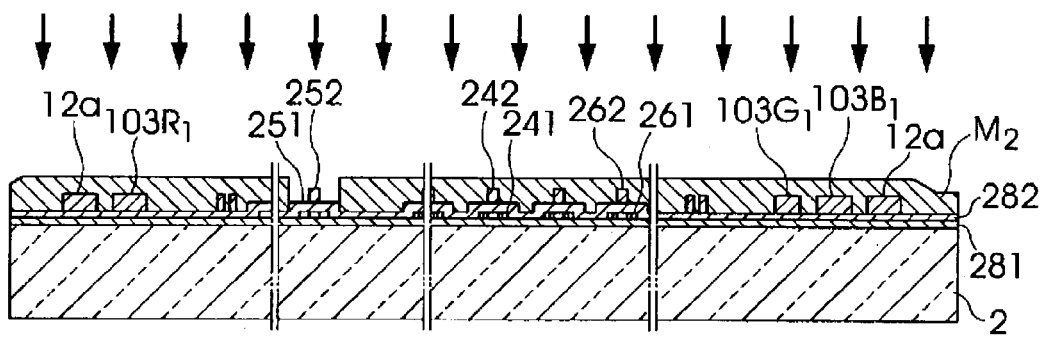
FIGS. 7(a)–7(c) are schematics describing a method for manufacturing the luminous device according to one exemplary embodiment of the invention.
Figure 7:
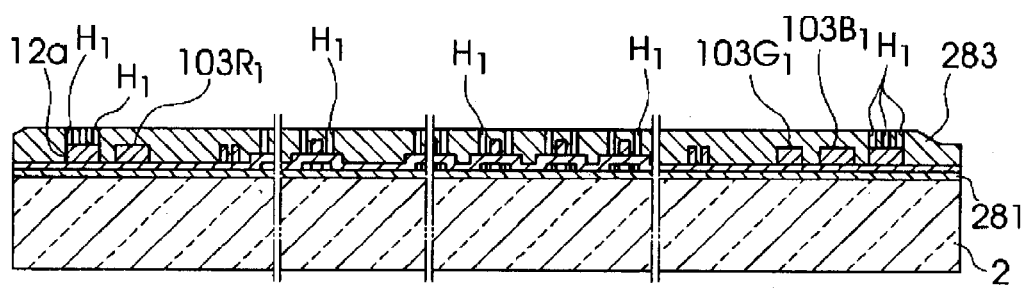
Figure 7:
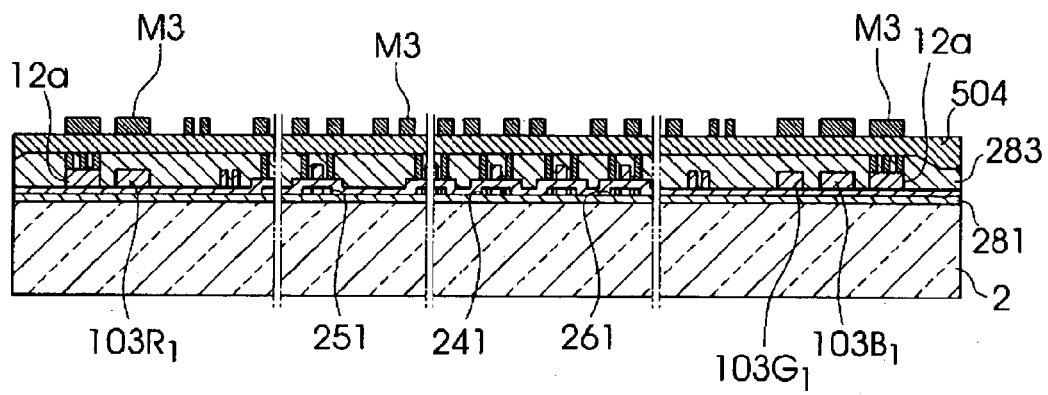
Figure 8:
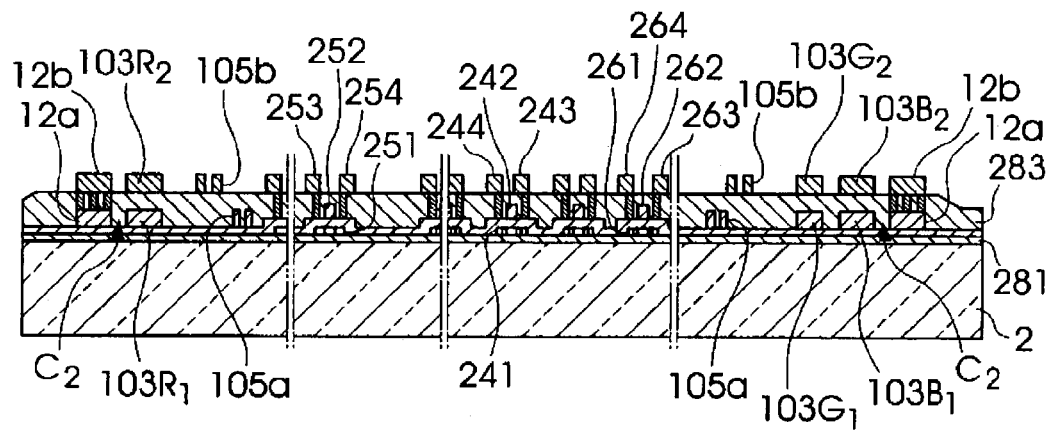
FIGS. 8(a)–8(c) are schematics describing a method for manufacturing the luminous device according to one exemplary embodiment of the invention.
Figure 8:
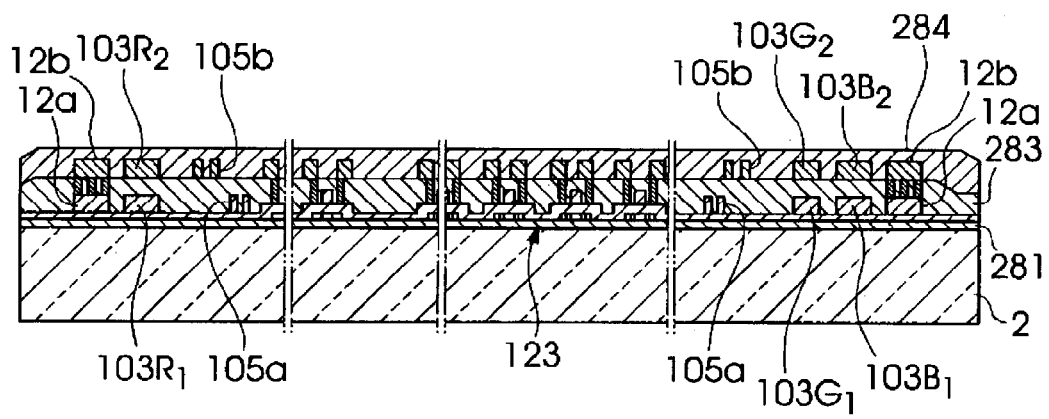
Figure 8:
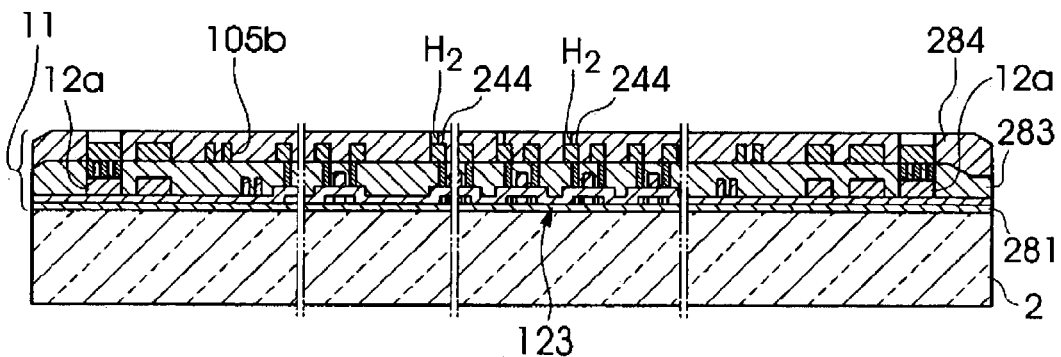
Figure 9:
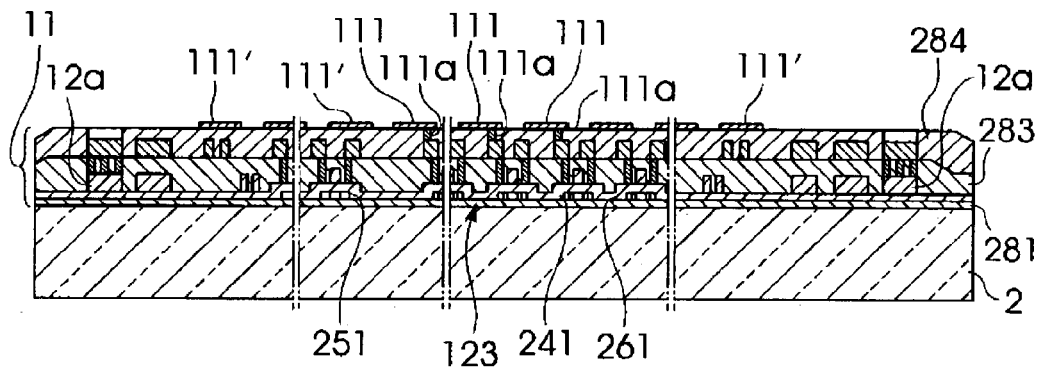
FIGS. 9(a)–(c) are schematics describing a method for manufacturing the luminous device according to one exemplary embodiment of the invention.
Figure 9:
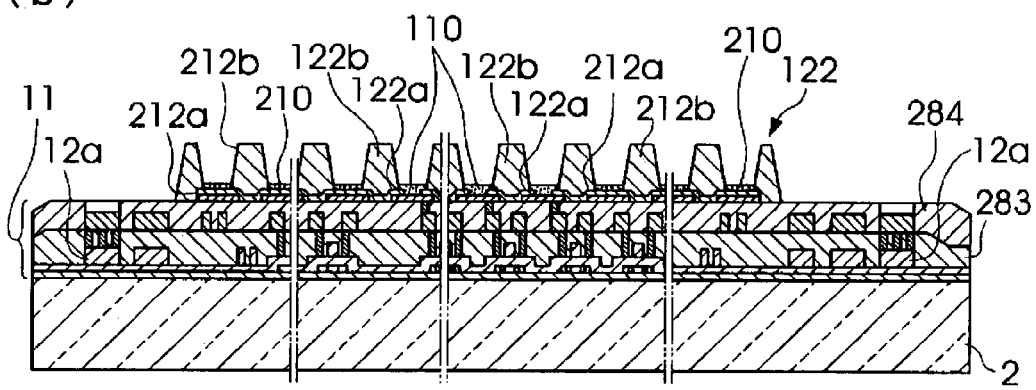
Figure 9:
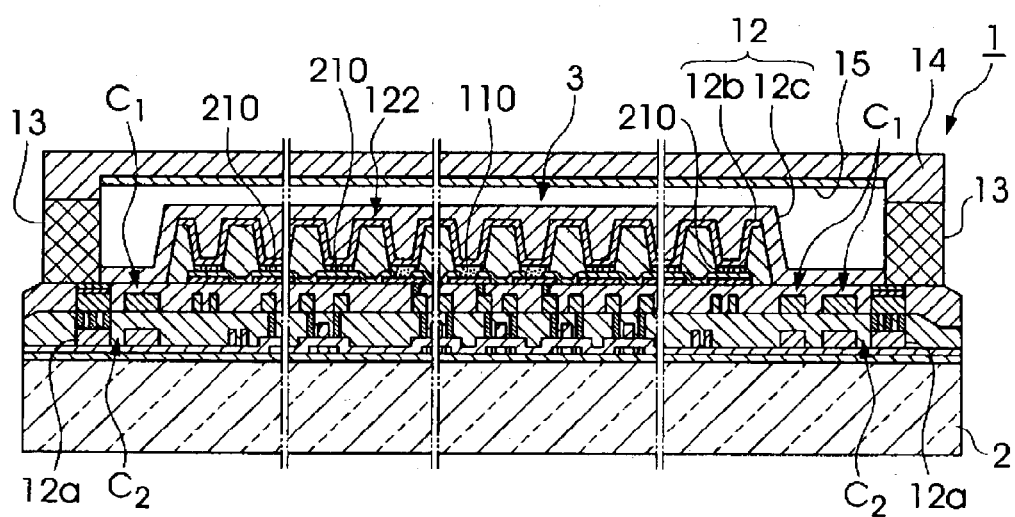

The structure of the circuit 11 including the current thin film transistor 123 is described in detail below. FIG. 5 is a cross-sectional view showing a significant part of the pixel electrode group region 11a. As shown in FIG. 5, the protective underlayer 281 mainly including $SiO_2$ is laminated on the surface of the substrate 2, and an islet of the silicon layer 241 is formed on the protective underlayer 281. The silicon layer 241 and protective underlayer 281 are coated with a gate insulation layer 282 mainly including $SiO_2$ and/or SiN. A gate electrode 242 is formed on the silicon layer 241 with interposition of the gate insulation layer 282.

While FIG. 5 shows the cross-sectional structure of the current thin film transistor 123, the switching thin film transistor 112 also has the same structure. The gate electrode 242 of the switching thin film transistor 112 is connected to the scanning line 101 shown in FIG. 4. The gate electrode 242 and gate insulation layer 282 are coated with the second interlayer insulation layer 283 mainly including $SiO_2$. A component "mainly including" as used in the specification means that the content of the component is the highest.

The region of the silicon layer 241 facing the gate electrode 242 with interposition of the gate insulation layer 282 is defined to be a channel region 241a. A low concentration source region 241b and a high concentration source region 241S are provided in the silicon layer 241 at the left side of the channel region 241a in FIG. 5. A low concentration drain region 241c and a high concentration drain region 241D are provided at the right side of the channel region 241a in FIG. 5, forming a so-called LDD (Light Doped Drain) structure. The current thin film transistor 123 is mainly formed of the silicon layer 241.

The high concentration source region 241S is connected to the source electrode 243 formed on the second interlayer insulation layer 283 through the contact hole 244 opening from the gate insulation layer 282 to the second interlayer insulation layer 283. The source electrode 243 constitutes a part of the signal line 102. The high concentration drain region 241D is connected, on the other hand, to the drain electrode 244 formed in the same layer as the source electrode 243 through the contact hole 245 opening from the gate insulation layer 282 to the second interlayer insulation layer 283.

The first interlayer insulation layer 284 is formed on the second interlayer insulation layer 283 on which the source and drain electrodes 243 and 244 are formed. A transparent pixel electrode 111 including ITO is formed on the first interlayer insulation layer 284, and is connected to the drain electrode 244 through the contact hole 111a formed in the first interlayer insulation layer 284. In other words, the pixel electrode 111 is connected to the high concentration drain electrode 241D in the silicon layer 241 through the drain electrode 244. While the pixel electrode 111 is formed at a position corresponding to the effective luminous region 4 as shown in FIG. 3, a dummy pixel electrode 111' having the same feature as the pixel electrode 111 is formed in the dummy region 5 formed around the effective luminous region 4. The dummy pixel electrode 111' has the same feature as the pixel electrode 111, except that it is not connected to the high concentration drain electrode 241D.

The luminous layer 110 and a bank (insulator) 122 are formed in the real pixel region (effective luminous region) 4 of the pixel portion 3. The luminous layer 110 is laminated on each pixel electrode 111, as shown in FIGS. 3 to 5. The bank 122 is provided between each pixel electrode 111 and each luminous layer 110 to partition each luminous layer 110. The bank 122 includes an inorganic bank layer 122a positioned at the substrate 2 side and an organic bank layer 122b positioned with a distance apart from the substrate 2, and these banks are laminated with each other. A light shielding layer may be disposed between the inorganic bank layer 122a and organic bank layer 122b.

The inorganic bank layer 122a and organic bank layer 122b are formed by being elongated onto the circumference of the pixel electrode 111, and the inorganic bank layer 122a is formed to be more elongated to the center of the pixel electrode than the organic bank layer 122b. The inorganic bank layer 122a preferably includes an inorganic material, such as $SiO2$, $TiO2$ and SiN. The inorganic bank layer 122a preferably has a thickness of 50 to 200 nm, particularly 150 nm. It is not preferable that the thickness is less than 50 nm, since the inorganic bank layer 122a becomes thinner than the positive hole injection/transfer layer to be described hereinafter to make it impossible to secure planarity of the positive hole injection/transfer layer. A thickness exceeding 200 nm is also not preferable, since the step height due to the inorganic bank layer 122a increases to make it impossible to secure planarity of the luminous layer laminated on the positive hole injection/transfer layer as described below.

The organic bank layer 122b is formed of a usual or related art resist, such as an acrylic resin and polyimide resin. The bank layer 122b has a thickness of preferably 0.1 to 3.5 μm, particularly about 2 μm. A thickness of less than 0.1 μm is not preferable, since the thickness of the organic bank layer 122b becomes larger than the combined thickness of the positive hole injection/transfer layer and luminous layer to make the luminous layer protrude out of the upper opening. A thickness of the organic bank layer exceeding 3.5 μm is not also preferable, since a step coverage of the cathode 12 formed on the organic bank layer 122b cannot be secured due to a large step height at the upper opening. A thickness of the organic bank layer 122b of more than 2 μm is more preferable, since insulation between the cathode 12 and pixel electrode 111 can be enhanced. Accordingly, the luminous layer 110 is formed to be thinner than the bank 122.

A region showing a liquidphile property and a region showing a liquid repelling property are formed around the bank 122. The liquidphile region includes the inorganic bank layer 122a and pixel electrode 111, and a liquidphile group, such as a hydroxyl group, is introduced into these regions by a plasma treatment using oxygen as a reactive gas. The liquid repelling region is the organic bank layer 122b, and a liquid repelling group, such as fluorine, is introduced by a plasma treatment using 4-fluoromethane as a reactive gas.

As shown in FIG. 5, the luminous layer 110 is laminated on the positive hole injection/transfer layer 110a laminated on the pixel electrode 111. The construction including the luminous layer 110 and positive hole injection/transfer layer 110a is referred to as a functional layer, and the construction including the pixel electrode 111, functional layer and cathode 12 is referred to as a luminous element in this specification. The positive hole injection/transfer layer 110a injects positive holes into the luminous layer 110, as well as transfers the positive holes in the positive hole injection/transfer layer 110a. Characteristics of the element, such as the light emitting efficiency and service life of the luminous layer 110, are enhanced by providing the positive hole injection/transfer layer 110a between the pixel electrode 111 and luminous layer 110. A fluorescent light is emitted from the luminous layer 110 by allowing the positive holes injected from the positive hole injection/transfer layer 110a to couple with electrons from the cathode 12. The luminous layer 11b includes three kinds of luminous layers of a red luminous layer emitting a red light (R), a green luminous layer emitting a green light (G) and a blue luminous layer emitting a blue light (R), and these luminous layers are arranged as stripes as shown in FIGS. 1 and 2.

As shown in FIGS. 3 and 4, the dummy luminous layer 210 and dummy bank 212 are formed in the dummy region 5 of the pixel portion 3. The dummy bank 212 includes a laminate of the dummy inorganic bank layer 212a positioned at the substrate 2 side, and the dummy organic bank layer 212b positioned with a distance apart from the substrate 2. The dummy inorganic bank layer 212a is formed over the entire surface of the dummy pixel electrode 111'. The organic dummy bank layer 212b is formed between the pixel electrodes 111 as the organic bank layer 122b. The dummy luminous layer 210 is formed on the dummy pixel electrode 111' with interposition of the dummy inorganic bank 212a.

The dummy inorganic bank layer 212a and dummy organic bank layer 211b are formed with the same material and thickness as the inorganic and organic bank layers 12a and 122b, respectively. The dummy luminous layer 210 is laminated on a dummy positive hole injection/transfer layer (not shown), and the material and thickness of the dummy positive hole injection/transfer layer and dummy luminous layer are the same as those of the positive hole injection/transfer layer 110a and luminous layer 110, respectively. Accordingly, the dummy luminous layer 210 is formed to be thinner than the dummy bank 212, as the luminous layer 110.

A uniform thickness of the luminous layer 110 of the effective luminous region 4 may be obtained while suppressing the display image from being irregular by disposing the dummy region 5 around the effective luminous region 4. Disposing the dummy region 5 permits drying conditions of a discharged composition ink to be constant within the effective luminous region 4 when the display element is formed by an ink-jet method, thereby eliminating the possibility of forming the luminous layer 110 with an uneven thickness at the circumference of the effective luminous region 4.

The cathode 12 is formed over the entire surface of the effective luminous region 4 and dummy region 5 with protrusion onto the substrate 2 at the outside of the dummy region 5, and is disposed to face the power line 103 at the outside of the dummy region 5, or at the outside of the pixel portion 3. The edge of the cathode 12 is connected to the cathode line 12a formed in the circuit 11. The cathode 12 flows an electric current to the luminous layer 110 as an opposed electrode to the pixel electrode 111.

The cathode 12 is constructed by laminating a cathode layer 12b including a laminate of lithium fluoride and calcium, and a reflection layer 12c. Only the reflection layer 12c of the cathode 12 is elongated to the outside of the pixel portion 3. The reflection layer 12c is provided to reflect the light emitted from the luminous layer 110 to the substrate 2 side, and is preferably formed of a laminate of, for example, Al, Ag and Mg/Ag. A protective layer to prevent oxidation including $SiO_2$ or SiN may be provided on the reflection layer 12b.

As shown in FIG. 4, the scanning line 101 formed on the protective underlayer 281 is disposed so as to locate under the dummy bank 212 as well as under the bank 212. This is because the distance between the scanning line 101 and cathode 212 can be increased by disposing the scanning line 101 under the dummy bank 212 and bank 212, thereby reducing the parasitic capacitance between the scanning line 101 and cathode 12.

A plurality of interlayer insulation layers (second interlayer insulation layer 283 and first interlayer insulation layer 284), and the bank 212 are disposed between the scanning line 101 and cathode 12 in this exemplary embodiment. Since the distance between the scanning line 101 and cathode 12 is increased, this arrangement is quite favorable to reduce the parasitic capacitance between the scanning line 101 and cathode 12. Reducing the parasitic capacitance enables time lag of the scanning signal supplied to the scanning line 101 to be reduced or suppressed, and the imaging signal is written in the pixel electrode 111 within a prescribed period of time, thereby preventing the contrast from decreasing.

An exemplary method for manufacturing the luminous device 1 according to the invention is described below. FIGS. 6(a) to 9(c) are schematics illustrating the method for manufacturing the luminous device according to one exemplary embodiment of the invention. The method for forming the circuit 11 on the substrate 2 is described with reference to FIGS. 6(a) to 8(c). Each cross-sectional view shown in FIGS. 6(a) to 8(c) corresponds to the cross-sectional view taken along plane A–A' in FIG. 2. The concentration of impurities in the following descriptions denotes the concentration of each impurity after activation by annealing.

As shown in FIG. 6(a), the protective underlayer 281 including a silicon oxide layer is formed on the substrate 2. Then, after depositing an amorphous silicon layer by an ICVD method or a plasma CVD method, crystal grains are allowed to grow into a polysilicon layer 501 by a laser annealing method or rapid heating method. The polysilicon layer 501 is patterned by a photolithographic method thereafter to form islets of the silicone layers 241, 251 and 261 as shown in FIG. 6(b), followed by forming a gate insulating layer 282 including a silicon oxide layer.

The silicon layer 241 is provided to form the current thin film transistor 123 (hereinafter "pixel TFT") that is formed at a position corresponding to the effective luminous layer 4 and is connected to the pixel electrode 111. The silicone layers 251 and 261 are formed into the P-channel and N-channel thin film transistor, respectively, in the scanning line addressing circuit (hereinafter "addressing circuit TFT").

The gate insulation layer 282 is formed by forming a silicon oxide layer with a thickness of about 30 to 200 nm that covers the silicon layers 241, 151 and 261, and protective underlayer 281 using a plasma CVD method or heat oxidation method. The silicon layers 241, 251 and 261 are simultaneously crystallized by forming the gate insulation layer 282 by taking advantage of the heat oxidation method, and these silicon layers are converted into polysilicon layers. Boron ions are implanted with a dope dosage of about $1 \times 10^{12}$ $cm^{-2}$ when the ions are introduced by a channel dope method at the timing of heat oxidation. Consequently, the silicon layers 241, 251 and 261 are converted into low concentration P-silicon layers with an impurity concentration of about $1 \times 10^{-17}$ $cm^{-3}$.

As shown in FIG. 6(c), an ion injection selection mask M1 is formed at a part of the silicone layers 241 and 261, and phosphorous ions are injected with a dope dosage of about $1 \times 10^{15}$ $cm^{-2}$. Consequently, high concentration of impurities are introduced in a self-alignment manner against the ion injection selection mask $M_1$, and the high concentration source regions 241S and 261s, and high concentration drain regions 241d and 261D are formed on the silicon layers 241 and 261, respectively.

Then, a doped silicon layer, a siliside layer, and a metal layer, such as an aluminum layer or tantalum layer with a thickness of about 200 nm, is formed on the gate insulation layer 282 after removing the ion injection selection mask $M_1$ as shown in FIG. 6(d). A gate electrode 252 of the p-channel addressing circuit TFT, the gate electrode 242 of the pixel TFT and a gate electrode 262 of the N-channel addressing circuit TFT are formed by patterning the metal layer. The signal line 105a for the scanning line addressing circuit, first power lines $103R_1$, $103G_1$ and $103B_1$, and a part of the cathode line 12a are simultaneously formed by patterning. The scanning line 101 shown in FIG. 4 is also formed when the gate electrodes 242, 252 and 262 are formed.

Then, phosphorous ions are doped into the silicon layers 241, 251 and 261 in a dope dosage of about $4\times10^{13}$ $cm^{-2}$ using the gate electrodes 242, 252 and 262 as masks. As a result, the low concentration impurities are introduced in a self alignment manner against the gate electrodes 242, 252 and 262, and the low concentration source regions 241b and 261b, and low concentration drain regions 241c and 261c are formed in the silicon layers 241 and 261, respectively, as shown FIG. 6(d). The low concentration impurity regions 251S and 251D are also formed in the silicon layer 251.

Then, an ion injection selection mask $M_2$ is formed over the entire surface except the periphery of the gate electrode 252 as shown in FIG. 7(a). Boron ions are injected against the silicon layer 251 with a dope dosage of $1.5\times10^{15}$ $cm^{-2}$ using the ion injection selection mask $M_2$. Consequently, the gate electrode 252 also functions as a mask, and high concentration of impurities are doped into the silicon layer 252 in a self-alignment manner. Accordingly, the low concentration impurity regions 251S and 251D are counter-doped to form the source and drain regions of the P-channel addressing circuit TFT.

Then, the second interlayer insulation layer 283 is formed on the entire surface of the substrate 2 as shown in FIG. 7(b), and holes $H_1$ to form the contact holes are provided at the positions corresponding to the source and drain electrodes and cathode line 12a of each TFT by patterning the second interlayer insulation layer 283 by photolithography. Then, a conductive layer 504 including a metal, such as aluminum, chromium and tantalum, is formed with a thickness of 200 to 800 nm, as shown in FIG. 7(c), so as to cover the second interlayer insulation layer 283, thereby forming the contact holes by embedding these metals in the previously formed holes $H_1$. A patterning mask $M_3$ is then formed on the conductive layer 504.

Then, as shown in FIG. 8(a), the conductive layer 504 is patterned using the patterning mask $M_3$, and the source electrodes 243, 253 and 263, drain electrodes 244 and 254, second power lines $103R_2$, $103G_2$ and $104B_2$, power line 105b for the scanning line circuit, and cathode line 12a of each TFT are formed.

The first power lines $103R_1$ and $103B_1$ are formed in the same layer level as the cathode line 12a with a distance therebetween as described above, and the second power lines $103R_2$ and $103B_2$ are formed in the same layer level as the cathode line 12b with a distance therebetween, thereby forming the second electrostatic capacitor $C_2$.

After completing the process as described above, the first interlayer insulation layer 284 covering the second interlayer insulation layer 283 is formed with a resin material, such as an acrylic resin, as shown in FIG. 8(b). The first interlayer insulation layer 284 is desirably formed with a thickness of about 1 to 2 μm. Then, as shown in FIG. 8(c), the portion of the first interlayer insulation layer 284 corresponding to the drain electrode 244 of the pixel TFT is removed by etching to form the contact hole $H_2$. The first interlayer insulation layer 284 on the cathode line 12a is simultaneously removed. The circuit 11 is thus formed on the substrate 2.

The procedure to obtain the luminous device 1 by forming the pixel portion 3 on the circuit 11 is described with reference to FIGS. 9(a)–9(c). The cross-sectional views shown in FIGS. 9(a)–9(c) correspond to the cross-section taken along plane A–A' in FIG. 2. As shown in FIG. 9(a), a thin layer including a transparent material, such as ITO, is formed so as to cover the entire surface of the substrate 2, and the contact hole 111a as well as the pixel electrode 111 and dummy electrode 111' are formed by filling the hole H2 provided on the first interlayer insulation layer 284 by patterning the thin layer. The pixel electrode 111 is only formed at the region for forming the current thin film transistor 123, and is connected to the current thin film transistor 123 (switching element) through the contact hole 111a. The dummy electrodes 111' are disposed as islets.

Subsequently, The inorganic bank layer 122a and dummy inorganic bank layer 212a are formed on the first interlayer insulation layer 284, pixel electrode 111 and dummy pixel electrode 111', as shown in FIG. 9(b). The inorganic bank layer 122a is formed so that a part of the pixel electrode 111 is open, and the dummy inorganic bank layer 212a is formed so as to completely cover the dummy pixel electrode 111'. The inorganic bank layer 122a and dummy inorganic bank layer 212a are formed above the scanning line 101 in the cross-section taken along plane B–B' in FIG. 2. The inorganic bank layer 122a and dummy inorganic bank layer 212a are formed by patterning the inorganic layers after forming the inorganic layers such as $SiO_2$, $TiO_2$ or SiN layer on the entire surface of the first interlayer insulation layer 284 and pixel electrode 111 by the CVD method, TEOS method, sputtering method or vacuum deposition method.

The organic bank layer 122b and dummy organic bank layer 212 are further formed on the inorganic bank layer 122a and dummy inorganic bank layer 212a, as shown in FIG. 9(b). The organic bank layer 122b is formed so that a part of the pixel electrode 111 is open through the inorganic bank layer 122a, and the dummy organic bank layer 212b is formed so that a part of the dummy inorganic bank layer 212a is open. The bank 122 is thus formed on the first interlayer insulation layer 284.

Subsequently, the liquidphile region and liquid repelling region are formed on the surface of the bank 122. Each region is formed by a plasma treatment process in this embodiment. For example, the plasma treatment process includes at least a liquidphile process to endow the pixel electrode 111, inorganic bank layer 122a and dummy inorganic bank layer 212a with liquidphile properties, and a liquid repelling process to endow the organic bank layer 122b and dummy organic bank layer 212b with liquid repelling properties.

The bank 122 is heated at a prescribed temperature (for example at 70 to 80° C.), and is subjected to a plasma treatment ($O_2$ plasma treatment) in an atmospheric environment as a liquidphile process. Subsequently, the bank is subjected to a plasma treatment using 4-fluoromethane as a reactive gas ($CF_4$ plasma treatment) in the atmospheric environment as a liquid repelling step. The liquidphile property and liquid repelling property are provided to respective sites by cooling the bank 122 heated by the plasma treatment to room temperature.

The luminous layer 110 and dummy luminous layer 210 are formed on the pixel electrode 111 and dummy inorganic bank layer 212a, respectively, by an ink-jet method. The luminous layer 110 and dummy luminous layer 210 are formed by discharging and drying a luminous layer material after discharging and drying a composition ink containing a positive hole injection/transfer material. The step to form the luminous layer 110 and dummy luminous layer 210 and the steps thereafter are preferably performed in an inert gas atmosphere, such as a nitrogen or argon atmosphere, in order to protect the positive hole injection/transfer layer from being oxidized.

Then, the anode 12 covering the bank 122, luminous layer 110 and dummy luminous layer 210 is formed, as shown in FIG. 9(c). The cathode 12 is obtained by forming the reflection layer 12c covering the cathode layer 12b and connected to the anode line 12a on the substrate 2, after forming the cathode layer 12b on the bank 122, luminous layer 110 and dummy luminous layer 210. The reflection layer 12c is disposed opposed to the power line 103 for the luminous layer with interposition of the first interlayer insulation layer 284 by allowing the reflection layer 12c to protrude out of the pixel portion 3 onto the substrate 2 so that the reflection layer 12c is connected to the cathode line 12a, and the first electrostatic capacitor C1 is formed between the reflection layer 12c (cathode) and light emission power line 103. Finally, a sealing material 13, such as an epoxy resin, is coated on the substrate 2 in order to bond the sealing substrate 14 on the substrate 2 with interposition of the sealing material 13. The luminous device as shown in FIGS. 1 to 4 is thus obtained by the process as described above.

Figure 10:
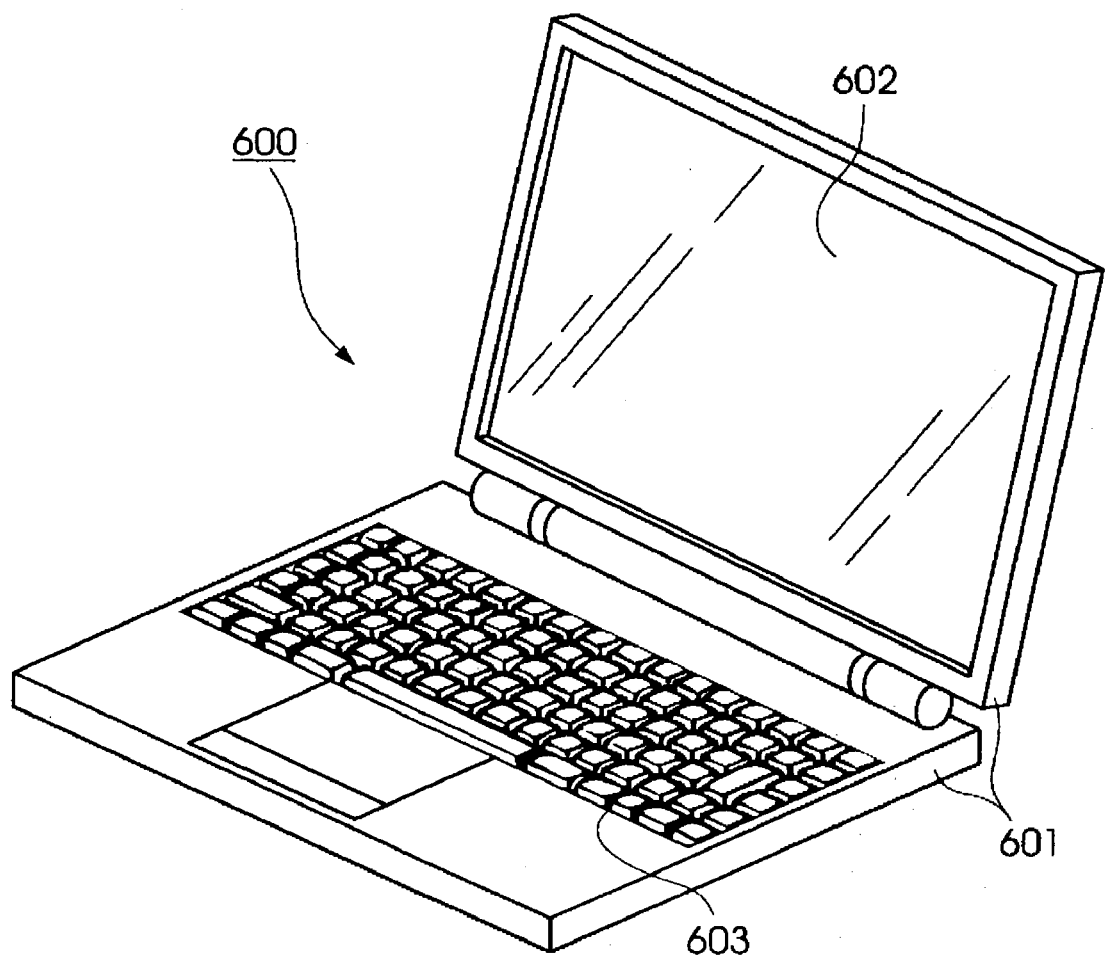
FIG. 10 is a schematic perspective view that shows an exemplary electronic appliance including the luminous device according to one exemplary embodiment of the invention.
Figure 11:
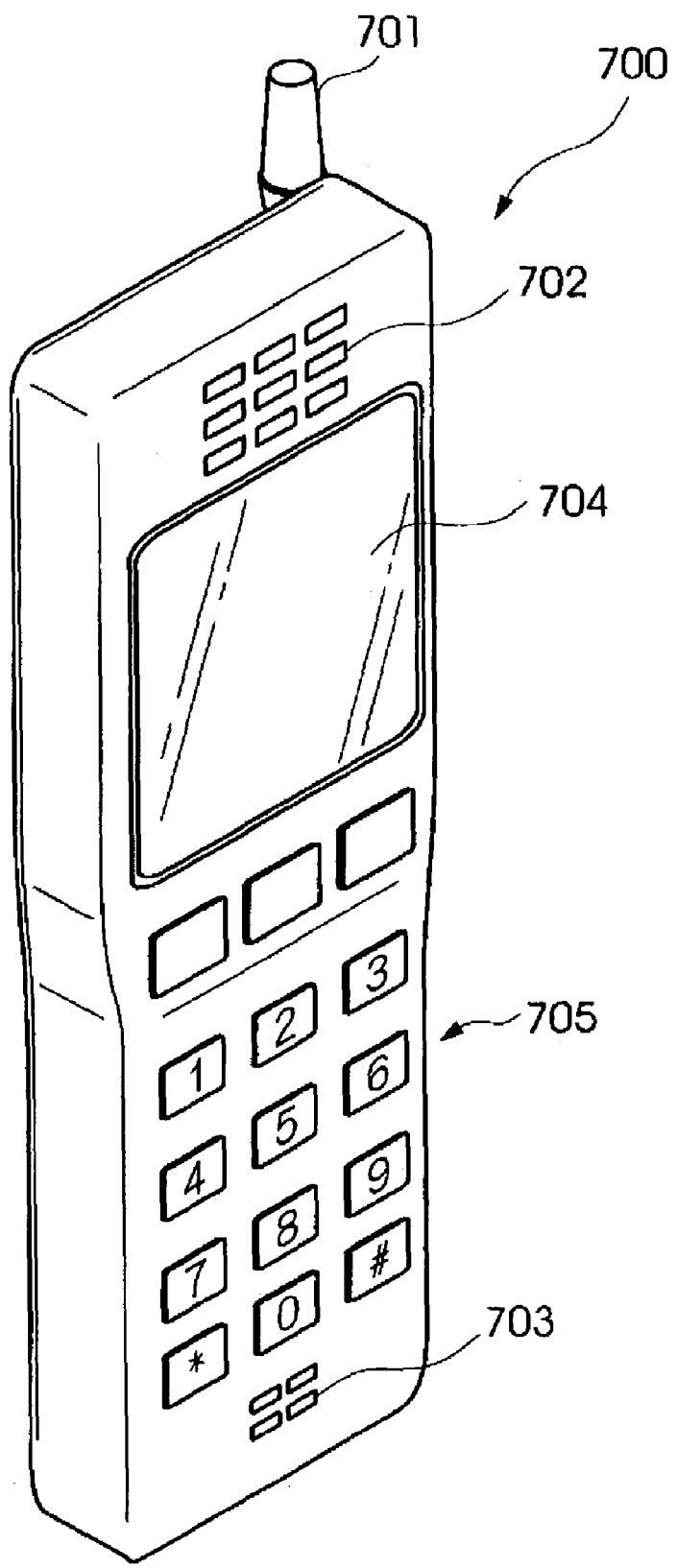
FIG. 11 is a schematic perspective view showing a portable phone as another exemplary electronic appliance.
Figure 12:
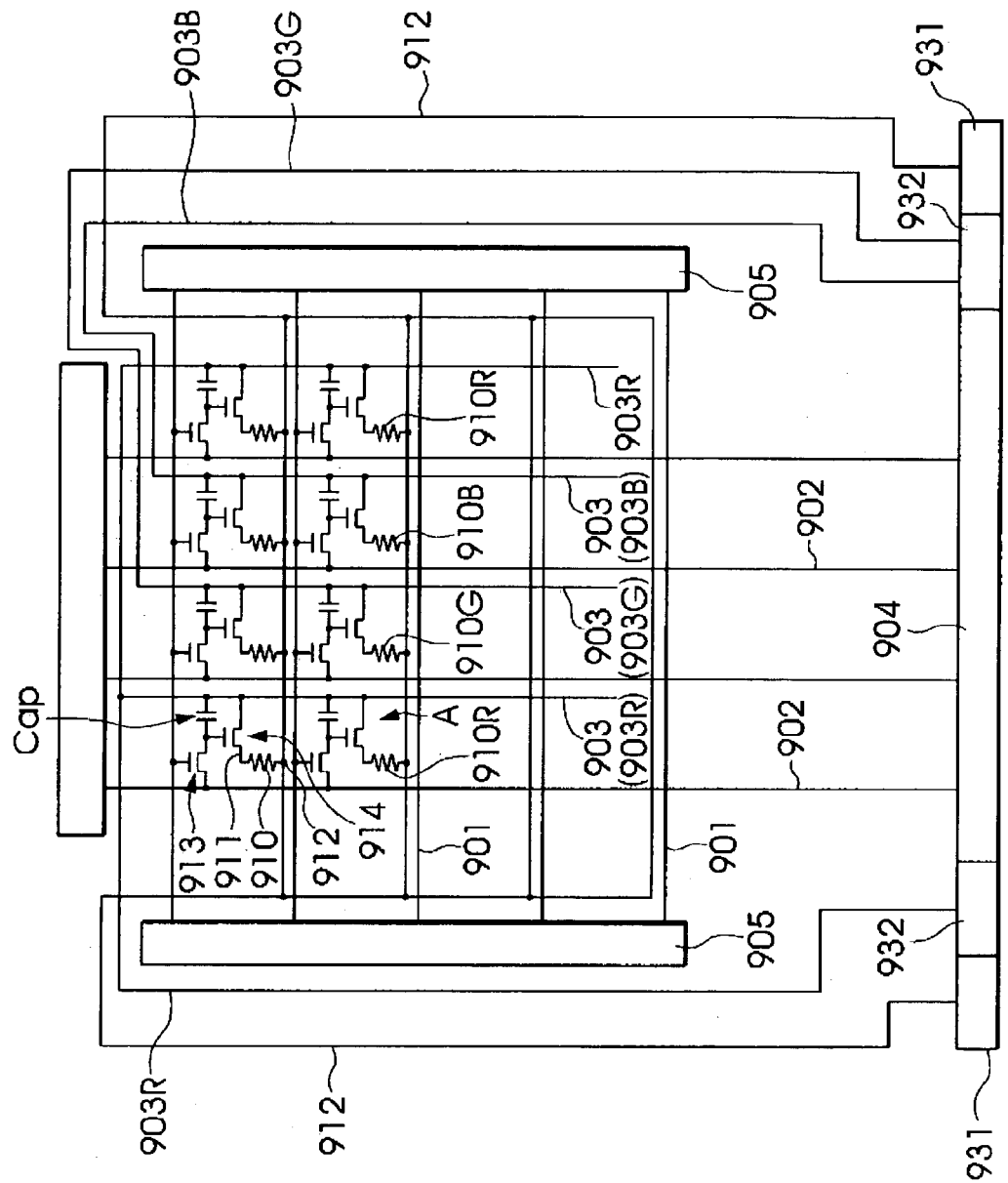
FIG. 12 is a schematic that shows the wiring diagram of a related art luminous device.

A notebook type personal computer 600 (electronic appliance) as shown in FIG. 10 is one exemplary electronic device that is manufactured by assembling electronic parts, such as the luminous device manufactured as described above, and includes a mother board including CPU (central processing unit), a key board and a hard disk, for example. FIG. 10 shows an example of an electronic appliance including the luminous device in one exemplary embodiment of the invention. As shown in FIG. 10, the computer 600 includes a case 601, and a key board 603. FIG. 11 is a perspective view showing a portable phone as another exemplary electronic appliance. The portable phone 700 shown in FIG. 11 includes an antenna 701, a receiver 702, a transmitter 703, a luminous device 704 and operating buttons 705.

While the notebook type computer and portable phone have been described an examples of electronic appliances in the exemplary embodiment, the application of the invention is not restricted thereto, and the invention may be used for various other electronic appliances, such as a projector, personal computer (PC) compatible with multi-media and engineering work station, pager, word processor, television, view finder or monitor type video-tape recorder, electronic notebook, electronic desktop calculator, car navigator, POS terminal and devices having a touch panel, for example.

ADVANTAGES

The luminous device according to the invention as described above is effective to decrease the parasitic capacitance since the scanning lines are also formed under the peripheral portion in the dummy region not contributing to display in addition to the effective luminous region contributing to display.

What is claimed is:

1. A luminous device, comprising:
a substrate;
a plurality of first electrodes formed above the substrate;
a second electrode formed above the substrate;
a switching element coupled to each of the plurality of first electrodes;
a plurality of luminous elements each of which includes a luminous layer formed between one of the plurality of first electrodes and the second electrode, the plurality of luminous elements being formed in an effective luminous region;
an insulation member formed in a dummy region at the outside of the effective luminous region; and
a scanning line that supplies a scanning signal to the switching element, a part of the scanning line being formed between the insulation member and the substrate.

2. The luminous device according to claim 1, an interlayer insulation layer being formed between the scanning line and the insulation member.

3. The luminous device according to claim 1, the second electrode covering the plurality of luminous elements.

4. A luminous device, comprising:
a substrate;
a plurality of first electrodes formed above the substrate, the plurality of first electrodes being formed in a first region and a second region adjacent to the first region, the plurality of first electrodes including a first group of first electrodes disposed in the first region and a second group of first electrodes in the second region;
a second electrode;
a plurality of pixel circuits each of which is coupled to one first electrode of the first group of first electrodes;
a plurality of luminous elements each of which includes a luminous layer formed between one of the first group of first electrodes and the second electrode;
an insulation member formed in the second region; and
a scanning line that supplies a scanning signal to at least one pixel circuit of the plurality of pixel circuits, a part of the scanning line being formed in a first layer that is located between the insulation member and the substrate, and
each of the second group of first electrodes being coupled to no pixel circuit.

5. The luminous device according to claim 4, further comprising a plurality of power lines that supply a power to the plurality of luminous elements through the plurality of pixel circuits, and
the power lines being formed in a second layer from the first layer.

6. The luminous device according to claim 5,
the second layer being located between the first layer and the second electrode.

7. The luminous device according to claim 5,
further comprising an interlayer insulation layer being formed between the plurality of power lines and the scanning line.

8. The luminous device according to claim 4, further comprising a plurality of luminous layers in the second region.

9. The luminous device according to claim 4,
the second electrode covering the first group of first electrodes and the second group of first electrodes.

10. The luminous device according to claim 4, further comprising a signal line that supplies a data signal to at least one pixel circuit of the plurality of pixel circuits, a part of the signal line being formed between the insulation member and the substrate.

11. A luminous device, comprising:

a substrate;

a plurality of first electrodes formed above the substrate;

a second electrode;

a plurality of luminous layers each of which is disposed between one of the plurality of first electrodes and the second electrode, the plurality of luminous elements including a first group of luminous layers that are disposed in a first region and a second group of luminous layers that are disposed in a second region, the first group of luminous layers emitting a light in response to supply of power to the first group of luminous layers, the second group of luminous layers not emitting a light in response to supply of power to the luminous device;

a plurality of pixel circuits each of which is coupled to one first electrode of the first group of first electrodes;

an insulation member formed in the second region; and a scanning line that supplies a scanning signal to at least one pixel circuit;

of the plurality of pixel circuits, a part of the scanning line being formed in a first layer that is located between the insulation member and the substrate.

12. The luminous device according to claim 11, further comprising a signal line that supplies a data signal to at least one pixel circuit of the plurality of pixel circuits, a part of the signal line being formed between the insulation member and the substrate.

13. The luminous device according to claim 11, the second electrode covering the first group of luminescent layers and the second group of luminescent layers.

14. The luminous device according to claim 11, further comprising a plurality of power lines that perform the supply of power to the first group of luminous layers.

15. The luminous device according to claim 14, the first layer being different from a second layer in which the plurality of power lines are formed.

16. The luminous device according to claim 15, the second layer being located between the second electrode and the first layer.

17. A luminous device, comprising:

a substrate;

a plurality of first electrodes formed above the substrate;

a second electrode;

a plurality of luminous layers each of which is disposed between one of the plurality of first electrodes and the second electrode, the plurality of luminous elements including a first group of luminous layers that are disposed in a first region and a second group of luminous layers that are disposed in a second region, the first group of luminous layers emitting a light in response to supply of power to the first group of luminous layers, the second group of luminous layers not emitting a light in response to supply of power to the luminous device;

a plurality of pixel circuits each of which is coupled to one first electrode of the first group of first electrodes;

an insulation member formed in the second region; and a signal line that supplies a scanning signal to at least one pixel circuit of the plurality of pixel circuits, a part of the signal line being formed in a first layer that is located between the insulation member and the substrate.

* * * * *